(12) United States Patent
Lee

(10) Patent No.: US 8,622,111 B1
(45) Date of Patent: Jan. 7, 2014

(54) LAMINATING DEVICE AND METHOD

(71) Applicant: Samsung Display Co., Ltd., Yongin (KR)

(72) Inventor: Youn-Bum Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/673,668

(22) Filed: Nov. 9, 2012

(30) Foreign Application Priority Data

Jul. 27, 2012 (KR) ........................ 10-2012-0082695

(51) Int. Cl.
  *B30B 12/00* (2006.01)

(52) U.S. Cl.
  USPC ............ 156/583.8; 156/64; 156/99; 156/103; 156/327; 156/350; 156/358; 156/360; 156/362; 156/363; 156/378; 156/379; 156/379.8; 156/580

(58) Field of Classification Search
  USPC ............. 156/64, 99, 103, 327, 350, 358, 360, 156/362, 363, 378, 379, 379.8, 580, 583.8
  See application file for complete search history.

(56) References Cited

U.S. PATENT DOCUMENTS

| | | | |
|---|---|---|---|
| 5,421,953 A | * | 6/1995 | Nagakubo et al. ............... 216/34 |
| 5,855,637 A | * | 1/1999 | Yakou et al. ................... 65/29.12 |
| 7,157,850 B2 | | 1/2007 | Miyazaki et al. |
| 7,163,739 B2 | | 1/2007 | Koike et al. |
| 2006/0011136 A1 | | 1/2006 | Yamazaki et al. |
| 2010/0090972 A1 | | 4/2010 | Kuwajima et al. |
| 2010/0239746 A1 | | 9/2010 | Yamazaki et al. |
| 2010/0271329 A1 | | 10/2010 | Oohira |

FOREIGN PATENT DOCUMENTS

| | | |
|---|---|---|
| JP | 2011-154021 | 8/2011 |
| KR | 10-2006-0040759 | 5/2006 |
| KR | 10-2009-0085730 | 8/2009 |
| KR | 10-2011-0110561 | 10/2011 |
| KR | 10-2011-0125593 | 11/2011 |
| KR | 10-2011-0131383 | 12/2011 |

\* cited by examiner

*Primary Examiner* — Yogendra Gupta
*Assistant Examiner* — Joshel Rivera
(74) *Attorney, Agent, or Firm* — Robert E. Bushnell, Esq.

(57) ABSTRACT

A laminating device for laminating a window on a display panel for displaying an image includes: a first plate on which the display panel is provided; a second plate on which the window is provided and which is adjacent to the first plate; an applier provided on the second plate and applying a resin on the window; a folder for connecting the first plate and the second plate, for folding to allow the second plate to face the first plate, and for disposing the window on the display panel with the resin therebetween; and a pressurizer for pressurizing the second plate in a direction of the first plate.

18 Claims, 5 Drawing Sheets

FIG.7A
FIG.7B
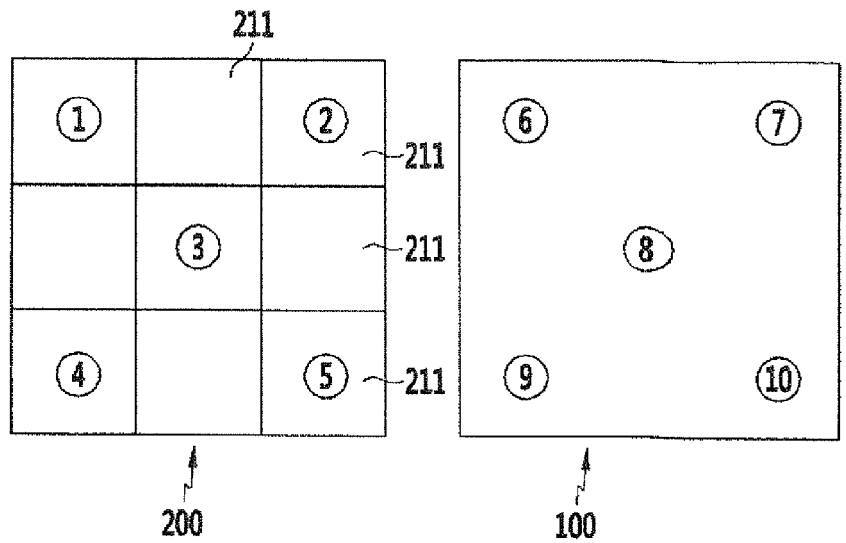
FIG.8
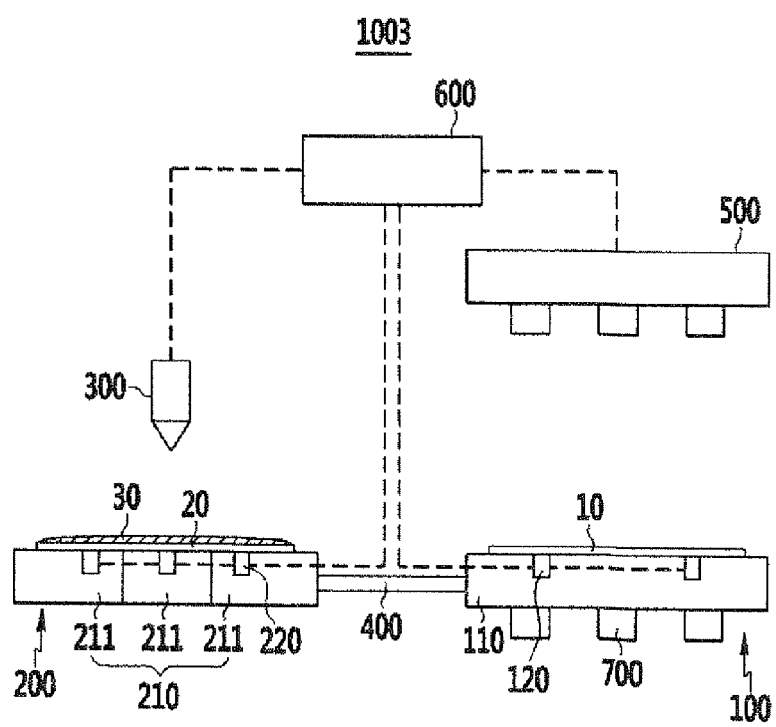

LAMINATING DEVICE AND METHOD

CLAIM OF PRIORITY

This application makes reference to, incorporates the same herein, and claims all benefits accruing under 35 U.S.C. §119 from an application earlier filed in the Korean Intellectual Property Office on the 27 Jul. 2012 and there duly assigned Serial No. 10-2012-0082695.

BACKGROUND OF THE INVENTION

1. Field of the Invention

The present invention relates generally to a laminating device and a laminating method. More particularly, the invention relates to a laminating device and a laminating method for laminating a window on a display panel for displaying an image.

2. Description of the Related Art

As a display device which displays an image, an organic light emitting diode (OLED) display has come into the spotlight in recent years.

Since the organic light emitting diode (OLED) display, unlike a liquid crystal display (LCD), has a self-light emitting characteristic so that a separate light source is not required, and a thickness and a weight thereof may be reduced. Furthermore, because the OLED display has high quality characteristics such as low power consumption, high luminance, and high reaction speed, the OLED display is appropriate for use in a mobile electronic device.

Recently, a touch sensor has been formed on a display panel such as an organic light emitting diode (OLED) display so as to manufacture a slim display module such as a smart phone, and a display panel array manufactured by laminating a window on a display panel by using a resin is supplied to display module manufacturers.

The above information disclosed in this Background section is only for enhancement of understanding of the background of the described technology and therefore it may contain information that does not form the prior art that is already known in this country to a person of ordinary skill in the art.

SUMMARY OF THE INVENTION

The present invention has been developed in an effort to provide a laminating device and a laminating method for laminating a window on a display panel by using a resin.

The present invention has been developed in another effort to provide a laminating device and a laminating method for laminating a window on a display panel while maintaining a thickness of a resin between the display panel and the window.

An embodiment of the invention provides a laminating device for laminating a window on a display panel for displaying an image, including: a first plate on which the display panel is provided; a second plate on which the window is provided and which neighbors the first plate; an applier provided on the second plate and applying a resin on the window; a folder for connecting the first plate and the second plate, that folds to allow the second plate to face the first plate, and that provides the window on the display panel with the resin therebetween; and a pressurizer for pressurizing the second plate in a direction of the first plate.

The first plate includes: a first plate main body on which the display panel is provided; and a first displacement sensor provided in the first plate main body, irradiating light to the display panel, and measuring a thickness of the display panel by using light reflected by the display panel.

The second plate includes: a second plate main body on which the window is provided; and a second displacement sensor provided in the second plate main body, irradiating light to the window, and measuring a thickness of the window by using light reflected by the window.

The second displacement sensor measures the thickness of the resin by using the light reflected by the resin applied to the window.

The plurality of second displacement sensors are provided on the second plate main body over an entire surface of the window.

The second plate main body includes a plurality of divided sub-plate main bodies, the second displacement sensor is provided on the plurality of sub-plate main bodies, respectively, and the pressurizer pressurizes the plurality of sub-plate main bodies.

The laminating device further includes a load sensor provided on a rear side of the first plate and sensing a load applied to the first plate.

The load sensor is provided on the rear side of the first plate corresponding to the sub-plate main bodies.

Another embodiment of the invention provides a method for laminating a window on a display panel displaying an image, including: providing a laminating device; providing the display panel on the first plate; providing the window on the second plate; applying a resin on the window; folding the folder to provide the window on the display panel with the resin therebetween; and pressurizing the second plate in a direction of the first plate to laminate the window on the display panel.

The applying of the resin on the window is performed when a thickness of the display panel and a thickness of the window are measured.

The laminating of the window on the display panel is performed when the thickness of the resin corresponding to an entire surface of the window is measured.

The laminating of the window on the display panel is performed when a load applied to the first plate is sensed.

According to the embodiments, the laminating device and laminating method for easily laminating the window on the display panel by using a resin are provided.

Also, the laminating device and the laminating method for maintaining the thickness of resin between the display panel and the window, and for laminating a window on the display panel, are provided.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIGS. 7A and 7B show top plan views of a second plate and a first plate, respectively, as shown in FIG. 6.

FIG. 8 to FIG. 10 show a laminating method performed according to a fourth embodiment of the invention.

DETAILED DESCRIPTION OF THE INVENTION

Figure 1:
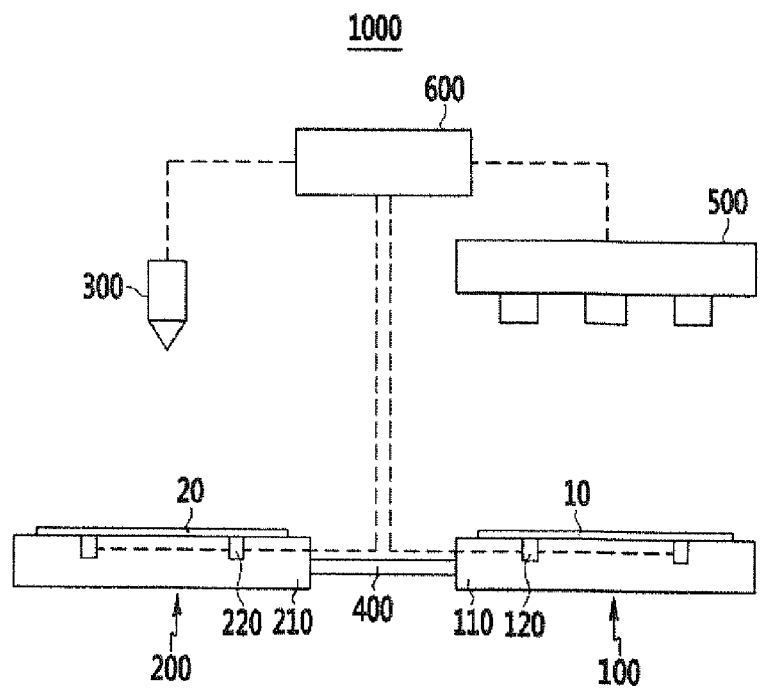
FIG. 1 shows a laminating device constructed as a first embodiment of the invention.

The present invention will be described more fully hereinafter with reference to the accompanying drawings, in which embodiments of the invention are shown. As those skilled in the art will realize, the described embodiments may be modified in various different ways, all without departing from the spirit or scope of the present invention.

The drawings and description are to be regarded as illustrative in nature and not restrictive. Like reference numerals designate like elements throughout the specification.

Furthermore, in several embodiments, constituent elements having the same construction are assigned the same reference numerals and are representatively described in connection with a first embodiment. In the remaining embodiments, and only different constituent elements from those of the first embodiment are described.

In addition, the size and thickness of each component shown in the drawings are arbitrarily shown for understanding and ease of description, but the present invention is not limited thereto.

In the drawings, the thickness of layers, films, panels, regions, etc., are exaggerated for clarity. In the drawings, for better understanding and ease of description, the thickness of some layers and areas is exaggerated. It will be understood that, when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. It will be understood that, when an element such as a layer, file, region, or substrate is referred to as being "on" another element, it can be on the other element or under the other element. The element may not be on another element in a gravity direction.

A laminating device according to a first embodiment will now be described with reference to FIG. 1.

FIG. 1 shows a laminating device according to a first embodiment of the invention.

As shown in FIG. 1, the laminating device 1000 for laminating a window 20 on a display panel 10, such as an organic light emitting diode (OLED) display or a liquid crystal display (LCD), having an image-displaying surface on which a touch sensor is formed or attached, includes a first plate 100, a second plate 200, an applier 300, a folder 400, a pressurizer 500, and a controller 600.

The display panel 10 is provided on the first plate 100 including a first plate main body 110 and a first displacement sensor 120.

The first plate main body 110 has a plate form on which the display panel 10 is provided.

The first displacement sensor 120 is provided in the first plate main body 110, and it irradiates light to the display panel 10 and uses the light reflected from the display panel 10 to measure a thickness of the display panel 10. For example, the first displacement sensor 120 is provided in the first plate main body 110 on the rear side of the display panel 10 and irradiates light to the display panel 10, and the light irradiated to the display panel 10 is reflected on an interface between the display panel 10 and an air layer, and is then provided to the first displacement sensor 120. The light applied to the first displacement sensor 120 is divided by a spectroscope, divided color information can be converted into distance information by the first displacement sensor 120, and the first displacement sensor 120 uses the distance information to measure the thickness of the display panel 10. In addition, the first displacement sensor 120 can be a displacement sensor disclosed by Japanese Patent Laid-Open Publication No. 2011-154021.

The first displacement sensor 120 is connected to the controller 600, and the thickness of the display panel 10 measured by the first displacement sensor 120 can be transmitted to the controller 600.

The second plate 200 neighbors the first plate 100, and the window 20 is provided on the second plate 200. The second plate 200 includes a second plate main body 210 and a second displacement sensor 220.

The second plate main body 210 has a plate form on which the window 20 is provided.

The second displacement sensor 220 is provided in the second plate main body 210, it irradiates light to the window 20, and uses the light reflected from the window 20 to measures the thickness of the window 20. For example, the second displacement sensor 220 is provided in the second plate main body 210 on the rear side of the window 20 to irradiate light to the window 20, and the light irradiated to the window 20 is reflected on the interface between the window 20 and the air layer, and is then provided to the second displacement sensor 220. The light applied to the second displacement sensor 220 is divided by a spectroscope, divided color information can be converted into distance information by the second displacement sensor 220, and the second displacement sensor 220 uses the distance information to measure the thickness of the window 20. A plurality of second displacement sensors 220 can be provided on the second plate main body 210 over the window 20.

The second displacement sensor 220 can be a displacement sensor disclosed by Japanese Patent Laid-Open Publication No. 2011-154021.

When the resin is applied on the window 20 by the applier 300, the second displacement sensor 220 uses the reflected light that is reflected from the interface between the resin and the air layer and applied to the second displacement sensor 220 to measure the thickness of the resin.

The second displacement sensor 220 is connected to the controller 600, and the thickness of the window 20 and the thickness of the resin measured by the second displacement sensor 220 are transmitted to the controller 600.

The applier 300 is provided on the second plate 200 and applies resin to the window 20. The resin applied to the window 20 can be an optically clear adhesive. The applier 300 is connected to the controller 600, and the amount of resin applied by the applier 300 is controllable by the controller 600.

The folder 400 connects the first plate 100 and the second plate 200, and it is folded to have the second plate 200 face the first plate 100 and to position the window 20 on the display panel 10 with the resin therebetween. The folder 400 is folded when the folder 400 is driven or when an additional driver for driving the first plate 100, the second plate 200, or the folder 400 is used.

The pressurizer 500 is provided on the first plate 100 and pressurizes the second plate 200 in a direction of the first plate 100. The pressurizer 500 is connected to the controller 600, and a pressurization state provided by the pressurizer 500 is controlled by the controller 600.

The controller 600 is connected to the first displacement sensor 120, the second displacement sensor 220, the applier 300, and the pressurizer 500, and it uses the thickness of the window 20, the thickness of the display panel 10, and the thickness of the resin applied to the window 20 to control the amount of resin applied by the applier 300 and the pressurization degree provided by the pressurizer 500.

A laminating method according to a second embodiment will now be described with reference to FIG. 2 to FIG. 5. The laminating method according to the second embodiment is performed by using the laminating device according to the first embodiment.

Figure 2:
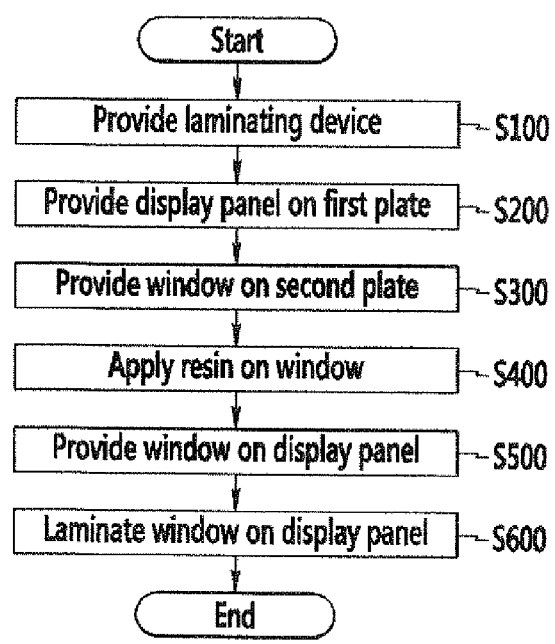
FIG. 2 shows a flowchart of a laminating method according to a second embodiment of the invention.
Figure 3:
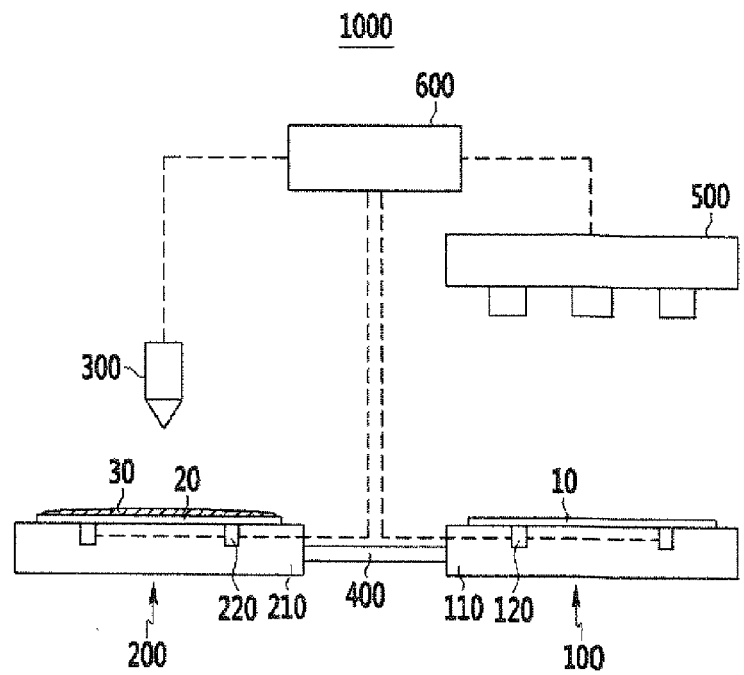
FIG. 3 to FIG. 5 show a laminating method performed according to the second embodiment of the invention.
Figure 4:
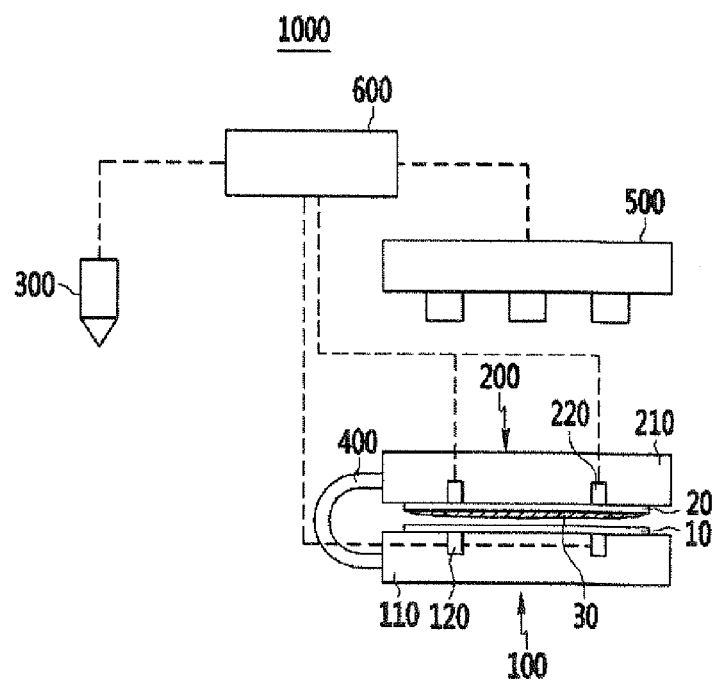
Figure 5:
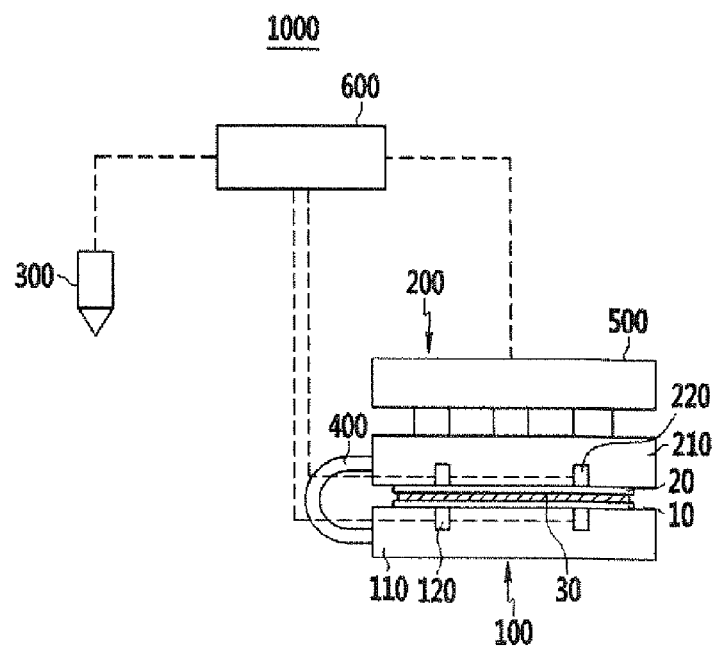

FIG. 2 shows a flowchart of a laminating method according to a second embodiment of the invention, and FIG. 3 to FIG. 5 show a laminating method according to the second embodiment of the invention.

As shown in FIG. 2 and FIG. 3, a laminating device 1000 is provided (S100).

A display panel 10 is provided on the first plate 100 (S200).

In detail, the display panel 10 is provided on the first plate main body 110. When the display panel 10 is provided on the first plate main body 110, the first displacement sensor 120 of the first plate 100 uses light to measure the thickness of the display panel 10, and the measured thickness is transmitted to the controller 600.

The window 20 is provided on the second plate 200 (S300).

In detail, the window 20 is provided on the second plate main body 210. When the window 20 is provided on the second plate main body 210, the second displacement sensor 220 of the second plate 200 uses light to measure the thickness of the window 20, and the measured thickness is transmitted to the controller 600.

A resin 30 is applied on the window 20 (S400).

In detail, the controller 600 uses the thickness of the display panel 10 transmitted by the first displacement sensor 120 and the thickness of the window 20 transmitted by the second displacement sensor 220 to determine the thickness of the resin 30 to be applied to the window 20, and the controller 600 controls the applier 300 to apply the resin 30 on the window 20 by the determined thickness of the resin 30. When the resin 30 is applied on the window 20 by the applier 300, the second displacement sensor 220 uses light to measure the thickness of the resin 30 applied on the window 20 in real time and transmits it to the controller 600, and the controller 600 uses the thickness of the resin 30 transmitted by the second displacement sensor 220 to control the applier 300, and the applier 300 applies the resin 30 on the window 20 at the determined thickness of the resin 30. That is, the amount of the resin 30 applied by the applier 300 is controlled based on the thickness of the window 20 and the thickness of the display panel 10.

As shown in FIG. 4, the window 20 is provided on the display panel 10 (S500).

In detail, the folder 400 is folded to dispose the second plate 200 on the first plate 100 so that the window 20 is provided on the display panel 10 with the resin 30 therebetween.

When the second plate 200 is disposed on the first plate 100 by folding of the folder 400 and the display panel 10 and the window 20 are provided on the initially established positions on the first plate 100 and the second plate 200, the window 20 is disposed at an accurate position on the display panel 10 without an additional alignment process.

Also, the second plate 200 is disposed on the first plate 100 by the folding of the folder 400 so that the laminating process time of the window 20 for the entire display panel 10 is reduced.

As shown in FIG. 5, the window 20 is laminated on the display panel 10 (S600).

In detail, the pressurizer 500 is used to pressurize the second plate 200 in the direction of the first plate 100, and in this instance, a plurality of second displacement sensors 220 provided on the second plate main body 210 over the entire window 20 are used to measure the thickness of the resin 30 over the window 20 in real time, and to control the pressurization degree of the pressurizer 500 so that the resin 30 may have the same thickness over the entire surface of the window 20. That is, the thickness of the resin 30 that is variable in real time by pressurization is measured to control the pressurization degree of the pressurizer 500.

The resin 30 can then be hardened by using a hardening means such as heat or ultraviolet (UV) rays.

As described, the laminating device according to the first embodiment and the laminating method according to the second embodiment use the thickness of the window 20 and the thickness of the display panel 10 to control the amount of the resin 30 applied by the applier 300, and measures the thickness of the resin 30 over the entire surface of the window 20 in real time during pressurization by the pressurizer 500 so as to control the pressurization degree of the pressurizer 500 so that the resin 30 can have the same thickness over the entire surface of the window 20, thereby easily laminating the window 20 on the display panel 10.

Furthermore, the laminating device according to the first embodiment and the laminating method according to the second embodiment laminate the window 20 on the display panel 10 so that the resin 30 can have the same thickness over the entire surface of the window 20, thereby improving the flatness of the window 20 and accordingly improving the quality of images displayed by the display panel 10.

That is, the laminating device for maintaining the thickness of the resin 30 between the display panel 10 and the window 20 and for laminating the window 20 on the display panel 10 according to the first embodiment, and the laminating method according to the second embodiment, are provided.

A laminating device according to a third embodiment will now be described with reference to FIG. 6 and FIGS. 7A and 7B.

Hereinafter, only specific portions that are different from those of the first embodiment are described, and omitted portions of description thereof coincide with the first embodiment. In addition, in the third embodiment, for better comprehension and ease of description, the same constituent elements are designated by the same reference numerals as in the first embodiment.

Figure 6:
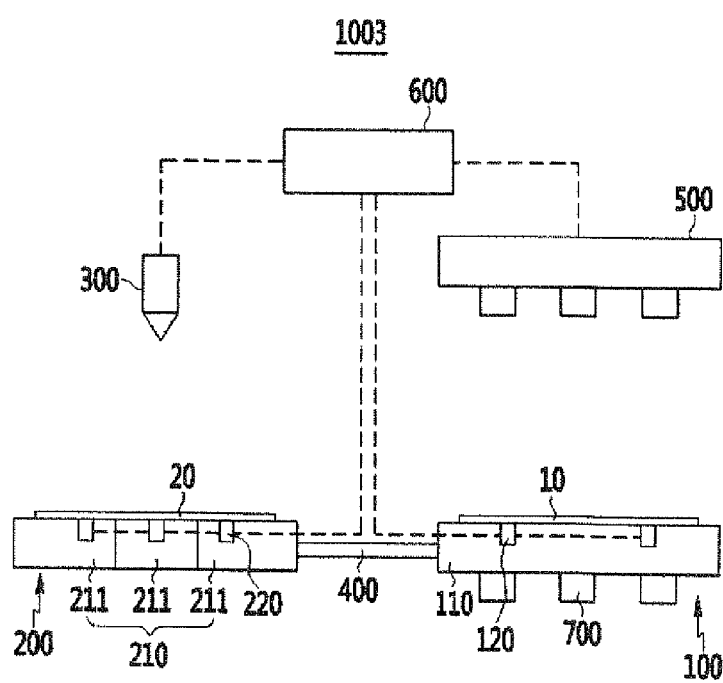
FIG. 6 shows a laminating device constructed as a third embodiment of the invention.

FIG. 6 shows a laminating device according to a third embodiment of the invention, and FIGS. 7A and 7B show top plan views of a second plate and a first plate, respectively, as shown in FIG. 6. That is, FIG. 7A shows a top plan view of the second plate and FIG. 7B shows a top plan view of the first plate.

As shown in FIG. 6 and FIGS. 7A and 7B, the laminating device 1003 for laminating a window 20 on a display panel 10, such as an organic light emitting diode (OLED) display or a liquid crystal display (LCD), having an image-displaying surface on which a touch sensor is formed or attached, includes a first plate 100, a second plate 200, an applier 300, a folder 400, a pressurizer 500, a controller 600, and a load sensor 700.

The second plate 200 neighbors the first plate 100, and the window 20 is provided on the second plate 200. The second plate 200 includes a second plate main body 210 and a second displacement sensor 220.

The second plate main body 210 has a plate form on which the window 20 is provided. The second plate main body 210 includes a plurality of divided sub-plate main bodies 211. For example, as shown in FIG. 7A, the second plate main body 210 can include nine (9) divided sub-plate main bodies 211.

The second displacement sensor 220 is provided on the sub-plate main bodies 211, respectively. For example, as shown in FIG. 7A, the second displacement sensor 220 is provided on the sub-plate main bodies 211 ① to ⑤ corresponding to a virtual X from among the nine sub-plate main bodies 211, and it can measure the thickness of the window 20 corresponding to the sub-plate main body 211 and the thickness of the resin applied on the window 20.

The pressurizer 500 of FIG. 6 is provided on the first plate 100, and independently pressurizes the sub-plate main bodies 211 of the second plate 200 so as to pressurize the second plate 200 in the direction of the first plate 100. The pressurizer 500 is connected to the controller 600, and the pressurization degree of the pressurizer 500 is controlled by the controller 600.

The controller 600 is connected to the first displacement sensor 120, the second displacement sensor 220, the applier 300, the pressurizer 500, and the load sensor 700, and uses the thickness of the window 20, the thickness of the display panel 10, the thickness of the resin applied on the window 20, and the load applied to the first plate 100 sensed by the load sensor 700 to control the amount of resin applied by the applier 300 and the pressurization degree provided by the pressurizer 500.

The load sensor 700 is provided on the rear of the first plate 100, and it senses the load applied to the first plate 100 by the pressurizer 500. The load sensor 700 is provided on the rear side of the first plate 100 corresponding to the sub-plate main bodies 211 of the second plate 200. For example, as shown in FIG. 7B, the load sensor 700 is provided on the points ⑥ to ⑩ of the first plate 100 corresponding to the sub-plate main bodies 211 on which the second displacement sensor 220 is provided, and independently senses the loads applied to ⑥ to ⑩ of the first plate 100. The load sensor 700 is connected to the controller 600, and it transmits load information applied to the first plate 100 to the controller 600.

A laminating method according to a fourth embodiment will now be described with reference to FIG. 8 to FIG. 10. The laminating method according to the fourth embodiment is performed by using the laminating device according to the third embodiment.

Hereinafter, only specific portions that are different from those of the second embodiment are described, and omitted portions of the description thereof coincide with the second embodiment. In addition, in the fourth embodiment, for better comprehension and ease of description, the same constituent elements are designated by the same reference numerals as in the second embodiment.

Figure 9:
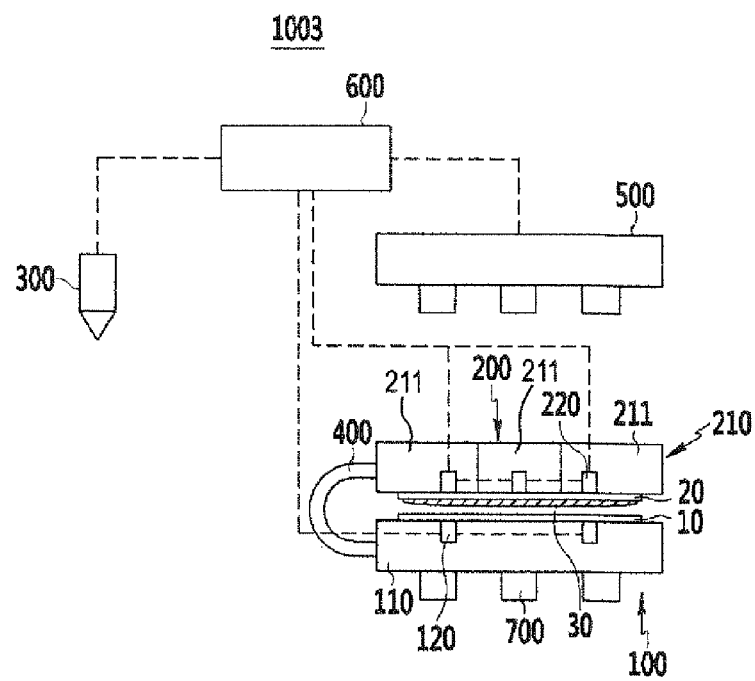
Figure 10:
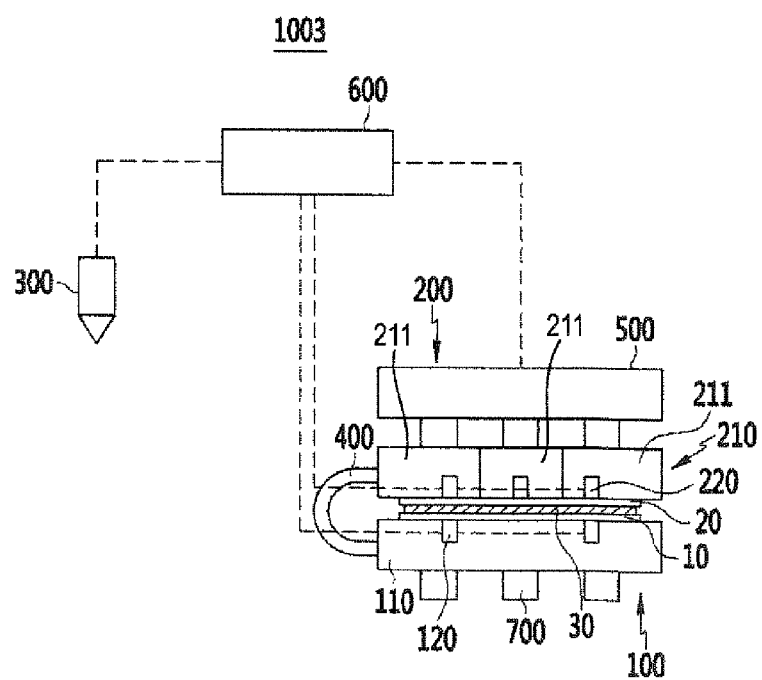

FIG. 8 to FIG. 10 show a laminating method according to a fourth embodiment of the invention.

As shown in FIG. 8, a laminating device 1003 is provided.
A display panel 10 is provided on a first plate 100.
A window 20 is provided on a second plate 200.
A resin 30 is applied on the window 20.
As shown in FIG. 9, the window 20 is provided on the display panel 10.
As shown in FIG. 10, the window 20 is laminated on the display panel 10.

In detail, the pressurizer 500 is used to pressurize the second plate 200 in the direction of the first plate 100, and in this instance, the second displacement sensors 220 provided on the second plate main body 210 over the entire surface of the window 20 are used to measure the thickness of the resin 30 over the entire surface of the window 20 in real time, and to control the pressurization degree of the pressurizer 500 so that the resin 30 may have the same thickness over the entire surface of the window 20. In this instance, the load sensor 700 senses the load applied to the first plate 100 so as to transmit load information to the controller 600, and the controller 600 uses the load information transmitted by the load sensor 700 and applied to the first plate 100, and the thickness of the resin 30 transmitted by the second displacement sensor 220, to independently pressurize the sub-plate main bodies 211 by using the pressurizer 500 so that the resin 30 may have the same thickness over the entire surface of the window 20.

The resin 30 can then be hardened by using a hardening means such as heat or ultraviolet (UV) rays.

As described above, the laminating device according to the third embodiment and the laminating method according to the fourth embodiment use the thickness of the window 20 and the thickness of the display panel 10 to control the amount of resin 30 applied by the applier 300, they use the second displacement sensor 220 during pressurization by the pressurizer 500 to measure the thickness of the resin 30 over the entire surface of the window 20 in real time, they use the load sensor 700 to measure the load degree applied to the first plate 100, and they control the pressurization degrees of the sub-plate main bodies 211 using the pressurizer 500 so that the resin 30 can have the same thickness over the entire surface of the window 20, thereby easily laminating the window 20 on the display panel 10.

Also, the laminating device according to the third embodiment and the laminating method according to the fourth embodiment laminate the window 20 on the display panel 10 so that the resin 30 can have the same thickness over the entire surface of the window 20, thus improving the flatness of the window 20 and improving quality of images displayed by the display panel 10.

That is, the laminating device for maintaining the thickness of the resin 30 between the display panel 10 and the window 20 and laminating the window 20 on the display panel 10 according to the third embodiment, and the laminating method according to the fourth embodiment, are provided.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A laminating device for laminating a window on a display panel for displaying an image, comprising:
    a first plate on which the display panel is provided;
    a second plate on which the window is provided and which is adjacent to the first plate;
    an applier provided on the second plate and applying a resin on the window;
    a folder for connecting the first plate and the second plate, and for folding to cause the second plate to face the first plate so as to dispose the window on the display panel with the resin therebetween; and
    a pressurizer for pressurizing the second plate in a direction of the first plate.

2. The laminating device of claim 1, the first plate including:
    a first plate main body on which the display panel is provided; and
    a first displacement sensor provided in the first plate main body irradiating light to the display panel, and measuring a thickness of the display panel by using light reflected by the display panel.

3. The laminating device of claim 2, the second plate including:
- a second plate main body on which the window is provided; and
- a second displacement sensor provided in the second plate main body for irradiating light to the window, and for measuring a thickness of the window by using light reflected by the window.

4. The laminating device of claim 3, the second displacement sensor measuring the thickness of the resin by using the light reflected by the resin applied to the window.

5. The laminating device of claim 4, a plurality of second displacement sensors being provided on the second plate main body over an entire surface of the window.

6. The laminating device of claim 5, the second plate main body including a plurality of divided sub-plate main bodies, the second displacement sensor being provided on the plurality of sub-plate main bodies respectively, and the pressurizer pressurizing the plurality of sub-plate main bodies.

7. The laminating device of claim 6, further comprising a load sensor provided on a rear side of the first plate and sensing a load applied to the first plate.

8. The laminating device of claim 7, the load sensor being provided on the rear side of the first plate corresponding to the sub-plate main bodies.

9. A method for laminating a window to a display panel displaying an image, comprising the steps of:
- providing a laminating device having a first plate, a second plate, and a folder for folding to cause the second plate to face the first plate;
- providing the display panel on the first plate;
- providing the window on the second plate;
- applying a resin on the window;
- folding the folder so as to dispose the window on the display panel with the resin therebetween; and
- pressurizing the second plate in a direction of the first plate so as to laminate the window on the display panel.

10. The method of claim 9, further comprised of applying the resin on the window when a thickness of the display panel and a thickness of the window are determined.

11. The method of claim 10, further comprised of laminating the window on the display panel when a thickness of the resin corresponding to an entire surface of the window is determined.

12. The method of claim 11, further comprised of laminating the window on the display panel when a load applied to the first plate is sensed.

13. The method of claim 9, further comprised of laminating the window on the display panel when a thickness of the resin corresponding to an entire surface of the window is determined.

14. The method of claim 13, further comprised of laminating the window on the display panel when a load applied to the first plate is sensed.

15. The method of claim 9, further comprised of laminating the window on the display panel when a load applied to the first plate is sensed.

16. The method of claim 9, further comprising the steps of irradiating light to the display panel, and determining a thickness of the display panel by using light reflected by the display panel.

17. The method of claim 16, further comprising the step of providing the first plate with a displacement sensor which irradiates the light to the display panel and provides an indication of the thickness of the display panel by using the light reflected by the display panel.

18. The method of claim 16, further comprising the step of providing the second plate with a displacement sensor which irradiates the light to the display panel and provides an indication of the thickness of the display panel by using the light reflected by the display panel.

* * * * *